(12) United States Patent
Mizusaki

(10) Patent No.: US 6,765,293 B2
(45) Date of Patent: Jul. 20, 2004

(54) ELECTRODE STRUCTURE OF A CARRIER SUBSTRATE OF A SEMICONDUCTOR DEVICE

(75) Inventor: Manabu Mizusaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/847,370

(22) Filed: May 3, 2001

(65) Prior Publication Data

US 2002/0008326 A1 Jan. 24, 2002

(30) Foreign Application Priority Data

May 12, 2000 (JP) ........................................ 2000-140174

(51) Int. Cl.[7] .............................................. H01L 23/48
(52) U.S. Cl. ...................................... 257/738; 257/779
(58) Field of Search ................................ 257/678, 734, 257/738, 778, 779, 786, 732, 780, 739; 438/612–613

(56) References Cited

U.S. PATENT DOCUMENTS

| 5,420,377 | A | * | 5/1995 | Bresin et al. ................. 174/263 |
| 5,783,865 | A | * | 7/1998 | Higashiguchi et al. ....... 257/774 |
| 5,872,399 | A | * | 2/1999 | Lee .............................. 257/738 |
| 5,962,922 | A | | 10/1999 | Wang |
| 6,028,366 | A | * | 2/2000 | Abe .............................. 257/779 |
| 6,037,667 | A | * | 3/2000 | Hembree et al. ............. 257/779 |
| 6,194,781 | B1 | * | 2/2001 | Ikegami ........................ 257/737 |
| 6,201,707 | B1 | * | 3/2001 | Sota .............................. 361/761 |
| 6,247,635 | B1 | * | 6/2001 | Olson ........................... 228/118 |
| 6,324,754 | B1 | * | 12/2001 | DiStefano et al. ............ 29/840 |
| 6,362,436 | B1 | * | 3/2002 | Kimbara et al. .............. 174/260 |

| 2002/0005591 | A1 | * | 1/2002 | Lin .............................. 257/784 |

FOREIGN PATENT DOCUMENTS

| EP | 0 631 313 A1 | 12/1994 |
| JP | A 5-62980 | 3/1993 |
| JP | 06-97637 | * 4/1994 |
| JP | 2595909 | 1/1997 |
| JP | A 9-64231 | 3/1997 |
| JP | A 11-317470 | 11/1999 |
| JP | A 11-330294 | 11/1999 |
| JP | 2000-183531 | * 6/2000 |

OTHER PUBLICATIONS

John H. Lau, "Chip Scale Package", 1999, McGraw–Hill.*

* cited by examiner

*Primary Examiner*—David A. Zarneke
*Assistant Examiner*—Scott B. Geyer
(74) *Attorney, Agent, or Firm*—Young & Thompson

(57) ABSTRACT

It is an object to provide an electrode structure of a carrier substrate of a semiconductor device in which the strength and the reliability of the joint portion between an electrode of a semiconductor package and an electrode of a main substrate are improved. A soldering land (103) that is an electrode of a carrier substrate (102) is hemispheric having a concentric hemispheric face hollow portion thereinside, a flange portion is provided in the circumferential portion thereof, and the outer diameter of the flange portion corresponds to the outer diameter of the conventional cylinder. Two slits (104) are provided in the flange portion and parts of a wall surface adjacent to the flange portion for venting air. A hemispheric face recess is provided in the carrier substrate (102) toward an outer surface, and the soldering land (103) is fixedly attached to the carrier substrate (102) so that the soldering land (103) is fitted into the recess and the flange portion abuts the outer surface of the carrier substrate.

20 Claims, 3 Drawing Sheets

304: SLIT
303: SOLDERING LAND

SLIT: 304　303: SOLDERING LAND
302: CARRIER SUBSTRATE

301: RESIN PART
303: SOLDERING LAND
302: CARRIER SUBSTRATE
403: SOLDER
401: PARENT SUBSTRATE
402: SOLDERING LAND

ELECTRODE STRUCTURE OF A CARRIER SUBSTRATE OF A SEMICONDUCTOR DEVICE

BACKGROUND OF THE INVENTION

1. Field of the Invention

The present invention relates to an electrode structure of a semiconductor device for solder-bonding to a main substrate.

2. Description of the Related Arts

In order to make personal home electric appliances such as a portable telephone, a video camera, and a personal computer small, compact, lightweight, the package of a semiconductor device has been changed from an LSI package having a gull-wing type lead electrode to a BGA (ball grid array) type or a CSP (chip scale package) type which are compact, lightweight packages. FIG. 5 is an outward view of a BGA type package semiconductor device, and (a) is a side view and (b) is a bottom view. FIG. 6 is a partial side view of a state where the BGA type package semiconductor device of FIG. 5 is bonded to a main substrate. The semiconductor element which is mounted to a carrier substrate 502 and is not shown in the drawing is sealed in a package composed of a resin part 501 and the carrier substrate 502, and an external terminal of the semiconductor element is connected to an external part via a soldering land 503 that is an electrode grid-like arranged on the carrier substrate 502. A soldering land 602 is provided at a position corresponding to the soldering land 503 of the carrier substrate 502 of the semiconductor device in the main substrate 601 in which the semiconductor device is mounted and is bonded to the soldering land 503 of the semiconductor substrate via solder 603. Both soldering land 503 and soldering land 602 have cylindrical shapes with low heights, their upper faces are generally smooth flat faces, and the smooth upper faces of both lands are bonded across the solder 603.

The interval of the lands becomes narrow and the areas of lands become small with miniaturization of a package, and thus a problem that the joint strength and the reliability of the lands by means of the solder become low has occurred.

It is an object of the present invention to provide an electrode structure of a carrier substrate of a semiconductor device in which the strength and the reliability of the joint portion between an electrode of a semiconductor package and an electrode of a main substrate are improved.

SUMMARY OF THE INVENTION

An electrode structure of a carrier substrate of a semiconductor device of the present invention is an electrode structure of a carrier substrate of a semiconductor device for solder-bonding the semiconductor device to a main substrate, wherein a recess is formed in a central area of the electrode, and the electrode has a through portion passing through between the recess and an outer portion of a circumferential wall surface surrounding the recess of the central area, on the circumferential wall surface.

The electrode may be hemispheric having a flange portion and has a concentric hemispheric face hollow portion thereinside, the hemispheric portion of the electrode may be fitted into a hemispheric recess provided on an outer surface in the carrier substrate of the semiconductor device, and the electrode may be fixedly attached to the carrier substrate so that the flange portion abuts the outer surface of the carrier substrate. The through portion passing through between the recess and the outer portion of the wall surface may be at least one slit provided in the flange portion and the wall surface of the electrode adjacent to the flange portion.

The electrode may be cylindrical having a flange portion and has a concentric cylindrical hollow portion thereinside, the cylindrical portion of the electrode may be fitted into a cylindrical recess provided on an outer surface in the carrier substrate of the semiconductor device, and the electrode may be fixedly attached to the carrier substrate so that the flange portion abuts the outer surface of the carrier substrate. The through portion passing through between the recess and the outer portion of the wall surface may be at least one slit provided in the flange portion and the cylindrical wall surface of the electrode adjacent to the flange portion to a position close to a bottom.

The package of the semiconductor device may be of a BGA type or a CSP type.

By forming a recess in a central area of the electrode, a joint area between a soldering land and solder increases, and the joint is three-dimensional. Further, since a through portion connecting the recess and the outer portion of the wall surface is provided, the air thereinside escapes, and solder becomes wet and spreads in the recess fully, whereby the same strength joint can be achieved by a small amount of solder and the interval between the carrier substrate and the main substrate can be narrowed

DETAILED DESCRIPTION OF THE PREFERRED EMBODIMENT

It is an object of the present invention to improve the structure of a soldering land that is an electrode for improving the reliability of a solder joint portion of a semiconductor device and particularly to improve the structure of a soldering land in a ball grid array package (hereafter, BGA) and a chip size package (hereafter, CSP) of an LSI.

Figure 1:
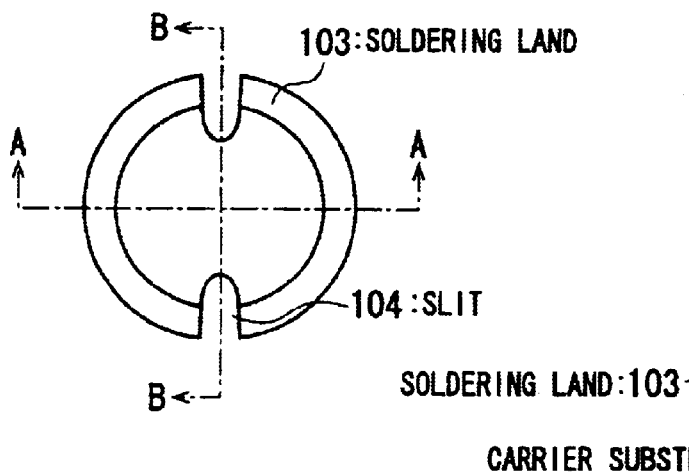
FIG. 1 is a schematic view showing an electrode structure of a carrier substrate of a semiconductor device of a first embodiment of the present invention, and (a) is a plan view, (b) is a side sectional view taken on the line A—A of (a), and (c) is a side sectional view taken on the line B—B of (a)
Figure 1:
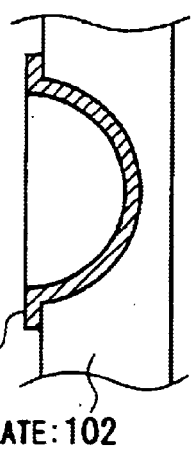
Figure 1:
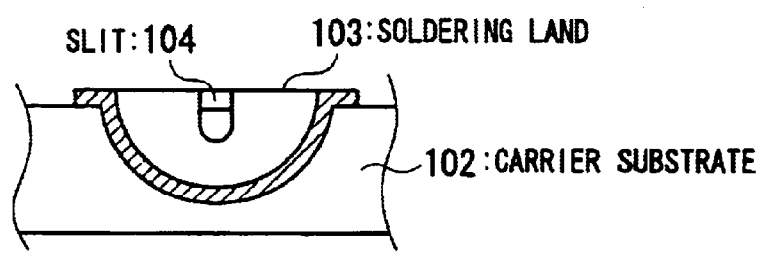
Figure 2:
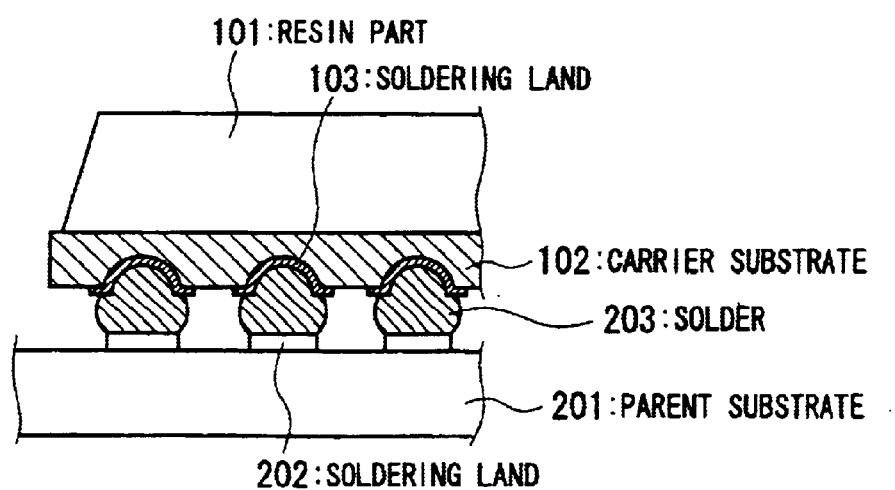
FIG. 2 is a partial side view of a state where the carrier substrate of the semiconductor device of FIG. 1 is bonded to a main substrate.

Next, embodiments of the present invention are explained referring to drawings. FIG. 1 is a schematic view showing an electrode structure of a carrier substrate of a semiconductor device of a first embodiment of the present invention, and (a) is a plan view, (b) is a side sectional view taken on the line A—A of (a), and (c) is a side sectional view taken on the line B—B of (a). FIG. 2 is a partial side view of a state where the carrier substrate of the semiconductor device of FIG. 1 is bonded to a main substrate.

Referring to FIG. 1, a soldering land 103 that is an electrode of a carrier substrate 102 which was conventionally cylindrical is hemispheric having a hollow portion of a concentric hemispheric face thereinside and is provided with a flange portion in the circumferential portion thereof in the first embodiment, and the outer diameter of the flange portion corresponds to the outer diameter of the conventional cylinder. Two slits 104 are provided in the flange portion and parts of a wall surface of the soldering land 103 adjacent to the flange portion for venting air. A hemispheric face recess is provided in the carrier substrate 102 toward an outer surface, and the soldering land 103 is fixedly attached to the carrier substrate 102 so that the soldering land 103 is fitted into the recess and the flange portion abuts the outer surface of the carrier substrate.

A semiconductor element which is mounted to the carrier substrate 102 and is not shown is sealed in a package composed of a resin part 101 and the carrier substrate 102, and an external terminal of the semiconductor element is connected to an external part via the soldering land 103 that is an electrode grid-like arranged on the carrier substrate 102.

As shown in FIG. 2, a soldering land 202 is provided at a position corresponding to the soldering land 103 of the carrier substrate 102 of the semiconductor device in the main substrate 201 in which the semiconductor device is mounted, and solder printing is implemented on the main substrate 201. Then, BGA and CSP having the hemispheric soldering land 103 having the recess are mounted to the main substrate 201 so that the soldering land 202 of the main substrate 201 and the soldering land 103 of the BGA and the CSP corresponding thereto are matched.

Then, these are thrown into a reflow furnace for soldering, printed solder 203 is melted, and the solder 203 becomes wet and starts spreading over the soldering land 202 of the main substrate 201 and the soldering land 103 of the BGA and the CSP. Air stagnates in the recess of the soldering land 103 of the BGA and the CSP, and usually the air prevents the solder 203 from invading into the recess. However, in the first embodiment of the present invention, since the air inside the recess escapes via the slits 104 shown in FIG. 1, it becomes possible for the solder 203 to become wet and spread in the recess fully. When they are taken out from the reflow furnace, the solder hardens, and the soldering land 103 of the carrier substrate 102 is bonded to the soldering land 202 of the main substrate 201.

By changing the structure of the soldering land 103 from a conventional flat face to a recess, the solder joint area can be increased, and the reliability of the joint portion can be improved.

In the explanation above, although the shape of the soldering land 103 is hemispheric having a hollow portion of a concentric hemispheric face thereinside and is provided with a flange portion in the circumferential portion thereof, the shape may be cylindrical having a hollow portion of hemispheric face thereinside, and a slit for venting air may be provided.

Figure 3A:
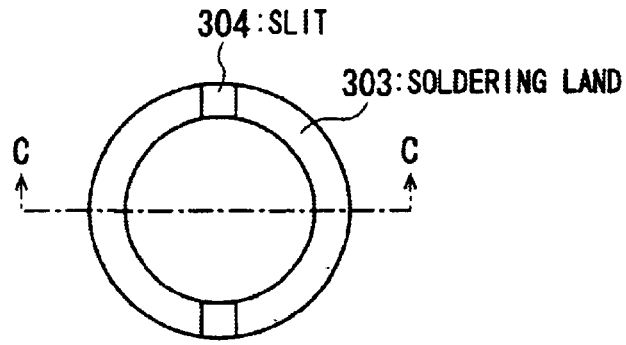
FIG. 3 is a schematic view showing an electrode structure of a carrier substrate of a semiconductor device of a second embodiment of the present invention, and (a) is a plan view and (b) is a side sectional view taken on the line C—C of (a)
Figure 3B:
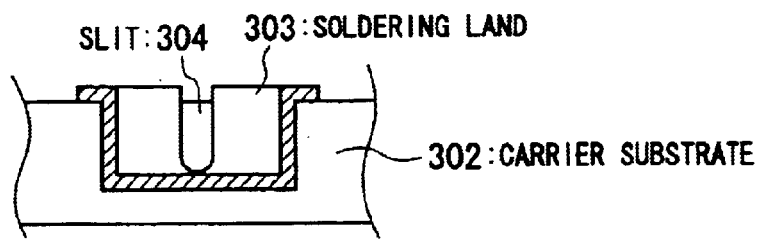
Figure 4:
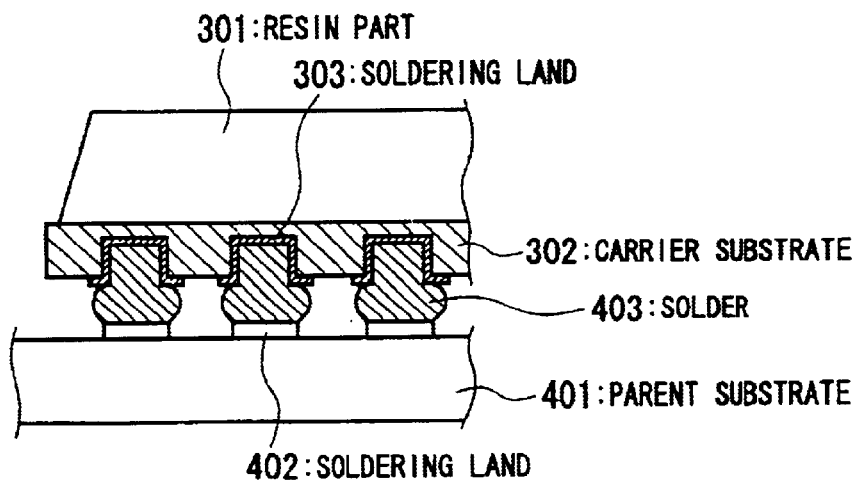
FIG. 4 is a partial side view of a state where the carrier substrate of the semiconductor device of FIG. 3 is bonded to a main substrate.
Figure 5A:
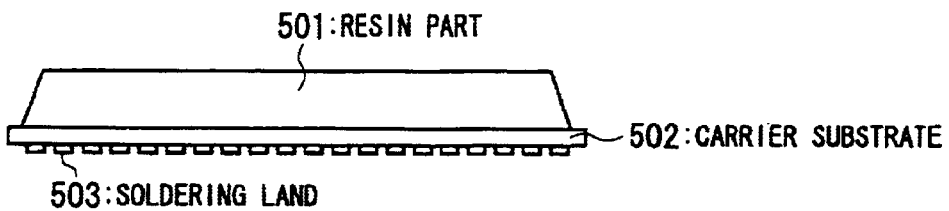
FIG. 5 is an outward view of a BGA type package semiconductor device, and (a) is a side view wand (b) is a bottom view.
Figure 5B:
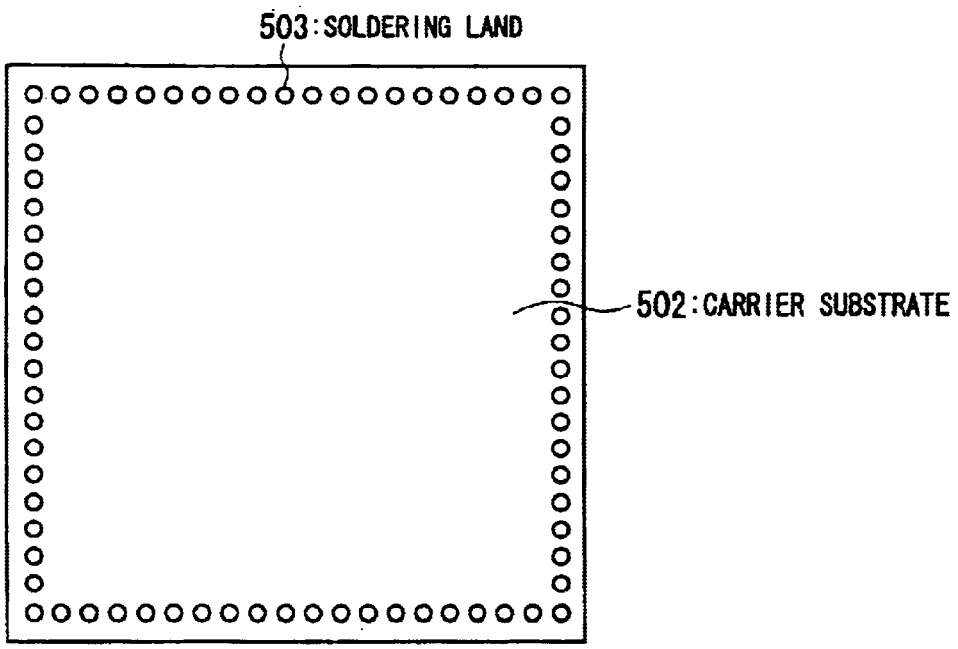
Figure 6:
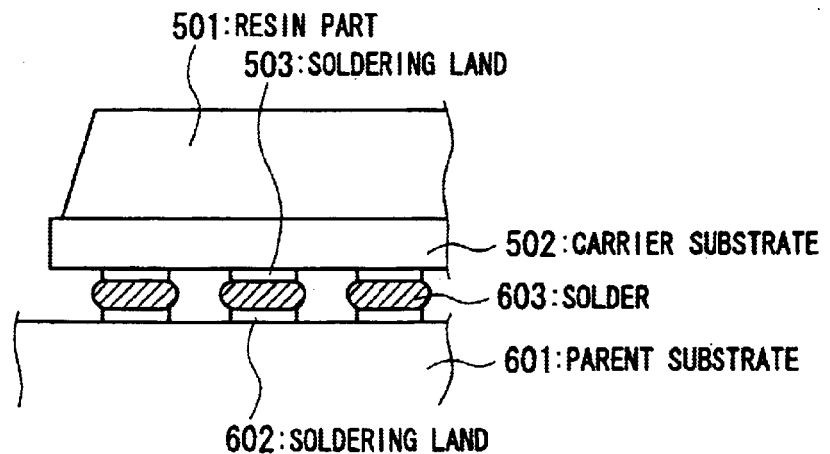
FIG. 6 is a partial side view of a state where the BGA type package semiconductor device of FIG. 5 is bonded to a main substrate.

Next, a second embodiment of the present invention is explained referring to drawings. FIG. 3 is a schematic view showing an electrode structure of a carrier substrate of a semiconductor device of the second embodiment of the present invention, and (a) is a plan view and (b) is a side sectional view taken on the line C—C of (a). FIG. 4 is a partial side view of a state where the carrier substrate of the semiconductor device of FIG. 3 is bonded to a main substrate.

Referring to FIG. 3, a soldering land 303 that is an electrode of a carrier substrate 302 which was conventionally cylindrical is cylindrical having a concentric cylindrical hollow portion thereinside and is provided with a flange portion in the circumferential portion of the upper portion thereof in the second embodiment, and the outer diameter of the flange portion corresponds to the outer diameter of the conventional cylinder. This is a similar structure to a through-hole and can be formed by a similar manufacturing method. Two slits 304 are provided in the flange portion and in a wall surface adjacent to the flange portion to positions close to the bottom face for venting air. A cylindrical recess is provided in the carrier substrate 302 toward an outer surface, and the soldering land 303 is fixedly attached to the carrier substrate 302 so that the soldering land 303 is fitted into the recess and the flange portion abuts the outer surface of the carrier substrate.

A semiconductor element which is mounted to the carrier substrate 302 and is not shown is sealed in a package composed of a resin part 301 and the carrier substrate 302, and an external terminal of the semiconductor element is connected to an external part via a soldering land 303 that is an electrode grid-like arranged on the carrier substrate 302.

As shown in FIG. 4, a soldering land 402 is provided at a position corresponding to the soldering land 303 of the carrier substrate 302 of the semiconductor device in the main substrate 401 in which the semiconductor device is mounted, and solder printing is implemented on the main substrate 401. Then, the BGA and the CSP having the cylindrical soldering land 303 having the hollow portion are mounted to the main substrate 401 so that the soldering land 402 of the main substrate 401 and the soldering land 303 of the BGA and the CSP corresponding thereto are matched.

Then, these are thrown into a reflow furnace for soldering, printed solder 403 is melted, and the solder 403 becomes wet and starts spreading over the soldering land 402 of the main substrate 401 and the soldering land 303 of the BGA and the CSP. Air stagnates in the hollow portion of the soldering land 303 of the BGA and the CSP, and usually the air prevents the solder 403 from invading into the hollow portion. However, in the second embodiment of the present invention, since the air inside the hollow portion escapes via the slits 304 shown in FIG. 3, it becomes possible for the solder 403 to become wet and spread fully. When they are taken out from the reflow furnace, the solder hardens, and the soldering land 303 of the carrier substrate 302 is bonded to the soldering land 402 of the main substrate 401.

By changing the structure of the soldering land 303 from a conventional flat face to a cylinder having a hollow portion, the solder joint area can be increased, and the reliability of the joint portion can be improved.

As described above, the present invention produces the following advantageous effects.

A first advantageous effect is that the strength and the reliability of a solder joint portion can be improved. This is because the joint area between a soldering land and solder is increased and the joint is three-dimensional.

A second advantageous effect is that the height of mounting can be restrained since the amount of solder of the solder joint portion can be reduced. This is because the same strength joint can be achieved by a small amount of solder and the interval between the carrier substrate and the main substrate can be narrowed since the joint between the soldering land and solder becomes three-dimensional, and thus the solder invades the inside of the soldering land.

What is claimed is:

1. An electrode structure of a carrier substrate of a semiconductor device for solder-bonding the semiconductor device to a main substrate, said electrode structure comprising:
   a carrier substrate having a recess in a central area of a surface thereof; and
   a soldering land of the electrode structure arranged in the recess and contacting an entirety of said surface defining said recess except for a passage therethrough, said soldering land having a circumferential wall defining a hollow portion extending from said surface, said circumferential wall being entirely within said recess,
   said passage being through an outer portion of said circumferential wall.

2. The electrode structure of the carrier substrate of the semiconductor device according to claim 1, wherein said soldering land is hemispherical-shaped having a flange portion, and having a concentric hemispherical hollow portion thereinside, wherein said recess is hemispherical-shaped and said hemispherical portion of said soldering land fits into said hemispherical-shaped recess, and said soldering land being fixedly attached to said carrier substrate so that said flange portion abuts said surface of said carrier substrate.

3. The electrode structure of the carrier substrate of the semiconductor device according to claim 2, wherein said passage is at least one slit portion provided in said flange portion and said circumferential wall of said soldering land adjacent to said flange portion.

4. The electrode structure of said carrier substrate of said semiconductor device according to claim 1, wherein said soldering land is cylindrical having a flange portion and having a concentric cylindrical hollow portion thereinside, wherein said recess is cylindrical, said cylindrical portion of said soldering land fitting into said cylindrical recess, and said soldering land is fixedly attached to said carrier substrate so that said flange portion abuts said first surface of said carrier substrate.

5. Said electrode structure of said carrier substrate of said semiconductor device according to claim 4, wherein said passage is at least one slit in said flange portion and a portion of said cylindrical wall adjacent to said flange portion.

6. The electrode structure of the carrier substrate of the semiconductor device according to claim 1, wherein a package of said semiconductor device is of a BGA (ball grid array) type.

7. The electrode structure of the carrier substrate of the semiconductor device according to claim 1, wherein a package of said semiconductor device is of a CSP (chip scale package) type.

8. The electrode structure according to claim 1, wherein said soldering land is structured and arranged so that a solder ball of a main substrate contacts an entirety of said soldering land, when the carrier substrate is connected to the main substrate.

9. An electrode structure comprising:
   a carrier substrate having a recess disposed on a surface thereof;
   a soldering land disposed in the recess, a wall of the soldering land defining an interior hollow portion and being arranged within the recess, a flange extending from an upper edge of the wall; and
   at least one slit through the wall and said flange providing a passage through the wall and the flange, said soldering land contacting an entirety of said surface defining said recess except for said at least one slit.

10. The electrode structure according to claim 9, wherein the wall is cylindrical.

11. The electrode structure according to claim 9, wherein the wall is hemispherical.

12. The electrode structure according to claim 9, wherein the flange extends above the surface of said carrier substrate.

13. The electrode structure according to claim 9, wherein the soldering land further comprises a flange, said flange extending above the surface of said carrier substrate, said at least one slit extending through the flange.

14. An electrode structure comprising:
   a carrier substrate having a recess disposed on a surface thereof;
   a cup-shaped soldering land disposed in said recess, a wall of the soldering land defining an interior hollow portion, said wall being entirely within said recess; and
   at least one slit through the wall extending from an upper edge of the wall and providing a passage through the wall.

15. The electrode structure according to claim 14, wherein the wall is cylindrical.

16. The electrode structure according to claim 14, wherein the wall is hemispherical.

17. The electrode structure as claimed in claim 14, wherein a bottom of said cup-shaped soldering land is an uninterrupted surface.

18. An electrode structure of a carrier substrate of a semiconductor device for solder-bonding the semiconductor device to a main substrate, comprising:
   a recess formed in a central area of the electrode structure;
   a circumferential wall surface covering walls and a bottom of said recess of said central area and entirely within said recess; and
   a through portion passing through said circumferential wall surface and connecting between an inside portion of said recess and an outer portion of said circumferential wall surface.

19. The electrode structure according to claim 18, wherein the electrode structure is cylindrical having a concentric cylindrical hollow portion thereinside, said circumferential wall surface surrounding said hollow portion, and a flange portion, and wherein said cylindrical hollow portion fits into a cylindrical recess provided on an outer surface of said carrier substrate of said semiconductor device, and said electrode structure is fixedly attached to said carrier substrate so that said flange portion abuts said outer surface of said carrier substrate.

20. The electrode structure according to claim 19, wherein said through portion is at least one slit in said flange portion and on said cylindrical circumferential wall surface adjacent to said flange portion, said slit extending from said flange portion to a position adjacent a bottom of said cylindrical circumferential wall surface.

* * * * *